United States Patent [19]

Hada

[11] Patent Number: 5,912,096
[45] Date of Patent: Jun. 15, 1999

[54] CHARGED-PARTICLE-BEAM EXPOSURE METHOD WITH TEMPERATURE-COMPENSATED EXPOSURE TO OFFSET EXPANSION AND CONTRACTION OF SUBSTRATE

[75] Inventor: Kazunari Hada, Ichihara, Japan

[73] Assignee: Nikon Corporation, Tokyo, Japan

[21] Appl. No.: 09/044,395

[22] Filed: Mar. 18, 1998

[30] Foreign Application Priority Data

Mar. 18, 1997 [JP] Japan .................................. 9-064827

[51] Int. Cl.$^6$ ............................... G03F 9/00; G03C 5/00
[52] U.S. Cl. .............................................. 430/30; 430/296
[58] Field of Search ........................................ 430/30, 296

*Primary Examiner*—Christopher G. Young
*Attorney, Agent, or Firm*—Klarquist Sparkman Campbell Leigh & Whinston, LLP

[57] ABSTRACT

Apparatus and methods are disclosed for increasing the throughput and accuracy of a charged-particle-beam (CPB) exposure apparatus. The apparatus comprises a CPB optical system for exposing a pattern onto a sensitive substrate in a vacuum chamber. During exposure, the substrate is placed on a movable stage. If the substrate temperature is not equal to the exposure-environment temperature, calibrated data on a temperature-correction factor of the substrate is obtained and used to convert XY coordinates for an exposure-environment temperature exposure of the substrate into corrected XY coordinates for exposure at the actual substrate temperature. Exposure of the substrate is positionally accurate even if, after exposure, the substrate undergoes expansion or contraction as the substrate equilibrates with the exposure-environment temperature.

4 Claims, 2 Drawing Sheets

CHARGED-PARTICLE-BEAM EXPOSURE METHOD WITH TEMPERATURE-COMPENSATED EXPOSURE TO OFFSET EXPANSION AND CONTRACTION OF SUBSTRATE

FIELD OF THE INVENTION

This invention pertains to charged-particle-beam exposure apparatus used in lithography for the production of semiconductors, including integrated circuits. In particular, this invention pertains to charged-particle-beam exposure apparatus that can perform exposure operations while the temperature of the sensitive substrate being exposed is changing.

BACKGROUND OF THE INVENTION OF THE INVENTION

Charged-particle beams such as electron beams or ion beams have recently been considered for use in lithography exposure processes for producing sub-micron level semiconductor integrated circuits. FIG. 4 is a schematic diagram depicting a structural configuration and processing sequence of a conventional charged-particle-beam (CPB) exposure apparatus. The CPB exposure apparatus of FIG. 4 includes an exposure-processing chamber 1, a load-lock chamber 3, and an atmospheric chamber 8. The exposure-processing chamber 1 is connected to the load-lock chamber 3 by a first gate valve 2, and the load-lock chamber 3 is connected to the atmospheric chamber 8 by a second gate valve 5. Multiple wafers 6 are stored in a wafer cassette 7.

As used herein, the term "wafer" encompasses any sensitive substrate suitable for use in CPB exposure apparatus, such as silicon wafers for semiconductor manufacture, glass plates for liquid crystal displays, and analogous structures.

CPB exposure processing requires that the exposure-processing chamber 1 be maintained under a constant vacuum condition (e.g, $10^-$Torr). It is therefore necessary to bring each wafer 6 from an atmospheric condition to such a vacuum condition prior to exposure processing in the exposure-processing chamber 1. This is accomplished by the following transport operations. The first gate valve 2 is closed and the second gate valve 5 is opened to bring the load-lock chamber 3 to atmospheric pressure. One of several wafers 6, located at position D in the atmospheric chamber 8, is transported to position C and then to position B in the load-lock chamber 3. The second gate valve 5 is then closed and the load-lock chamber 3 is rapidly evacuated until the pressure inside the load-lock chamber 3 matches the vacuum condition in the exposure-processing chamber 1. The first gate valve 2 is then opened and the wafer 6 is transported from position B to position A in the exposure-processing chamber 1. The first gate valve 2 is closed, and exposure processing begins in the exposure-processing chamber 1. Meanwhile, the load-lock chamber 3 is returned to atmospheric pressure and another wafer 6 is transported sequentially through positions D-C-B, whereupon the load-lock chamber 3 is evacuated again.

When exposure processing of a wafer 6 is completed, the first gate valve 2 is opened and the processed wafer 6 is removed from the exposure-processing chamber 1 to position E in the load-lock chamber 3, while the unprocessed wafer 6 at position B is transported to position A. The wafer 6 at position E is then transported to position D via position F after the load-lock chamber 3 is returned to atmospheric pressure.

The above transport and exposure-processing operations are repeated on multiple respective wafers 6.

When the load-lock chamber 3 is rapidly evacuated the temperature of the gas remaining in the load-lock chamber decreases due to adiabatic expansion. This reduced-temperature gas typically cools the wafer 6 by approximately 2–3° C., causing the wafer 6 to contract. In the case of an 8-inch silicon wafer, the overall diameter of the wafer typically decreases by approximately 0.5 μm per °C. of temperature decrease. If exposure patterns are made on an 8-inch silicon wafer while the temperature of the wafer is different than the operating temperature of the exposure-processing chamber 1, the position of the exposure patterns made in peripheral regions of the wafer will be in error by approximately 0.25 μm per °C. of temperature difference (when compared with an exposure pattern made on an 8-inch silicon wafer that is at the operating temperature throughout exposure). This level of positional error is several orders of magnitude too high for high-level-integration semiconductor manufacturing. In order to stay within the desired positional-error limit of 10 nm or less, the wafer temperature must be maintained within ±0.02° C. of the operating temperature of the exposure-processing chamber 1.

At the moment the wafer 6 is first transported into the exposure-processing chamber 1, the wafer temperature is less than the operating temperature of the exposure-processing chamber 1, causing the wafer temperature to increase slowly. Exposure processing of the wafer 6 should not be initiated until the temperature of the entire surface of the wafer 6 has stabilized. In the foregoing example of an 8-inch silicon wafer, temperature stabilization may require ten or more minutes per wafer. Such waiting times of this magnitude are intolerable-modern semiconductor manufacturing processes are expected to provide throughput levels of 30–60 wafers/hour, i.e., on e wafer every 1–2 minutes. Therefore, the waiting time per wafer must be minimized to achieve such an expected throughput.

SUMMARY OF THE INVENTION

In view of the foregoing shortcomings of conventional apparatus, an object of this invention is to provide charged-particle-beam (CPB) exposure apparatus exhibiting higher throughput by exposing a wafer while the temperature of the wafer is unstable. The invention is exemplified by a preferred apparatus embodiment that accomplishes this objective by adaptably controlling the exposure by redirecting the electron-beam position to correct for exposure-pattern positional errors caused by temperature-induced wafer expansion and contraction.

According to one aspect of the invention, a CPB exposure apparatus is provided that comprises a substrate stage, movable in X and Y directions, for holding and positioning a sensitive substrate (e.g., a resist-coated wafer) during exposure. A CPB optical system is situated so as to direct a charged-particle beam onto a surface of the sensitive substrate to expose a pattern onto the surface. A temperature sensor measures the temperature of the sensitive substrate. A computer, connected to the substrate stage, the CPB optical system, and the temperature sensor, controllably adjusts the CPB optical system and/or the position of the substrate stage in the X and Y directions, to compensate for a difference in XY dimensions of the sensitive substrate at a substrate temperature, at the time of exposure, that is different from the exposure-environment temperature at time of exposure, so as to expose the charged-particle beam at a desired location on the sensitive substrate. A stage controller can be used to position the wafer stage in the X and Y directions, with the X and Y coordinates of the stage position being measured by a position sensor. The position-measuring sensor is preferably a laser interferometer. A coordinate counter can be used to determine the stage-position coordinates of the wafer based on data from the position-measuring sensor.

The wafer stage is preferably situated in an exposure-processing ("vacuum") chamber that is preferably connected to a load-lock chamber by a gate valve. The CPB optical system is preferably housed in a column connected to the exposure-processing chamber and situated so as to direct a charged-particle beam (e.g., an electron beam) onto a surface of the sensitive substrate to expose a pattern onto the surface.

By way of example, a column housing an electron-optical system typically comprises an electron gun for producing an electron beam, one or more lenses for focusing the electron beam, and one or more deflectors for deflecting the electron beam, etc. A deflector controller controls the trajectory of the electron beam through the column by selectively energizing the deflectors in the column.

The temperature sensor is preferably a thermistor or an equivalent device that preferably contacts the wafer and continuously outputs the wafer temperature to a host computer or analogous processor that controls the overall operations of the apparatus. A coordinate converter, comprising a coordinate-conversion calculator and a lookup table, is connected to the host computer. (Alternatively, the functions performed by the coordinate converter can be integrated in and performed by the host computer.) The coordinate-conversion calculator receives position data from the coordinate counter and performs a coordinate-conversion calculation to determine exposure coordinates that compensate for temperature-induced wafer expansion and contraction. The coordinate converter outputs control signals to the deflector controller as required.

A calibration can be performed on a standard wafer so as to determine standard-wafer temperature-correction factors at various incremental wafer temperatures within a range including the exposure-environment temperature. The standard wafer is similar to wafers actually exposed subsequently. The standard wafer preferably defines multiple marks (at least three) that are positioned, e.g., in opposing pairs so as to define X and Y axes. The calibration can also provide a determination of the "contraction center" of the standard wafer.

During calibration, the temperature of the standard wafer is increased or decreased relative to the exposure-environment temperature. A series of wafer-position and temperature measurements are performed while sequentially positioning the standard wafer so that each of the marks is in axial alignment with the charged-particle beam. These measurements, the data from which are stored in the host computer, are cyclically repeated until the temperature of the standard wafer stabilizes at the exposure-environment temperature. The host computer calculates a wafer contraction-center coordinate by interpolating the changes in the mark coordinates. The host computer then calculates the temperature-correction factors over the temperature range based on the calculated contraction-center coordinate and the stored position and temperature data. The temperature-correction factors and corresponding temperatures are stored in a lookup table.

During subsequent exposure of sensitive substrates, the calibration data is used to correct for temperature-induced expansion and contraction of the substrates so as to produce an accurate exposure pattern on each substrate even if the substrate temperature is not equal to the exposure-environment temperature. The temperature of the substrate is continuously measured and routed to the lookup table. The lookup table outputs data on the temperature-correction factor, based on the substrate temperature measurements, to the coordinate-conversion calculator. The coordinate-conversion calculator then determines corrected exposure-position coordinates based on the position of the wafer relative to the wafer contraction center, the coefficient of linear expansion, and the difference between the wafer temperature and the exposure-environment temperature. The host computer then sends commands to the deflector controller and/or the stage controller so as to expose the wafer at the corrected exposure-position coordinates.

The foregoing and additional features and advantages of the invention will be more readily apparent from the following detailed description, which proceeds with reference to the accompanying drawings.

DETAILED DESCRIPTION

Figure 1:
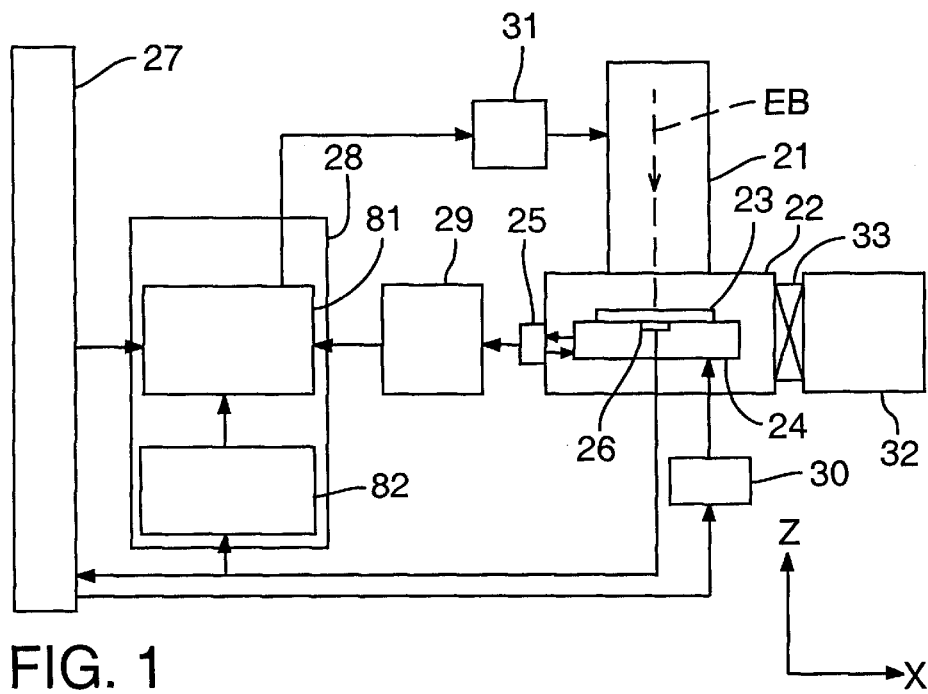
FIG. 1 is a block schematic diagram of a charged-particle-beam (CPB) exposure apparatus according to the invention.

A preferred embodiment of a charged-particle-beam (CPB) exposure apparatus according the invention is shown in FIG. 1. The FIG.-1 embodiment is configured especially for use with an electron beam. An electron-optical lens column 21 illuminates an electron beam EB onto a sensitive substrate (e.g., resist-coated wafer) in an exposure-processing ("vacuum") chamber 22. It will be understood that the electron-optical column 21 comprises (although not shown) an electron gun, lenses for focusing the electron beam EB, and deflectors for deflecting the electron beam EB, etc. A deflector controller 31 controls the trajectory of the electron beam EB through the electron-optical column 21 by selectively energizing deflectors in the column. A wafer stage 24 on which a wafer 23 is placed for exposure is located in the vacuum chamber 22. A position-measuring sensor 25 (e.g., laser interferometer or analogous device) is used for measuring the XY position of the wafer stage 24. Movement of the wafer stage 24 in the XY directions is controllably actuated by a stage controller 30. Wafer temperature is measured by a temperature sensor 26. The temperature sensor 26 can be a thermistor or the like that contacts the wafer 23 while the wafer rests on the wafer stage 24. Access into the electron-optical column 21 is preferably via a load-lock chamber 32 separated from the electron-optical column 21 by a gate valve 33.

A host computer 27, which controls the overall operations of the FIG. 1 apparatus, is connected to a coordinate converter 28. The coordinate converter 28 comprises a coordinate-conversion calculator 81 and a lookup table 82. A coordinate counter 29 determines the stage-position coordinates of a location on the wafer 23 based on data from the position-measuring sensor 25, and inputs the stage-position coordinates to the coordinate-conversion calculator 81. Rather than being separate components as shown, the coordinate converter 28 (with coordinate-conversion calculator 81 and lookup table 82) and the coordinate counter 29 can be included within the host computer 27.

Figure 2:
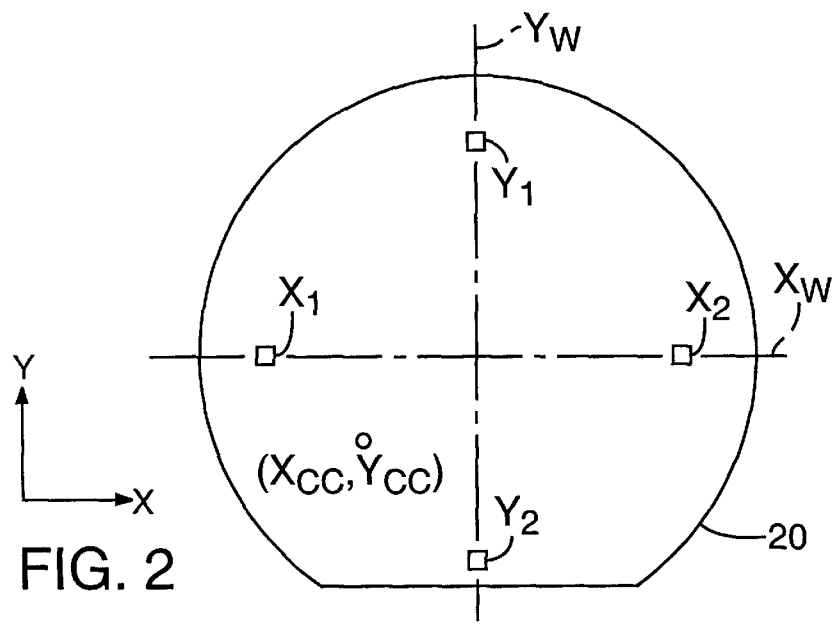
FIG. 2 is a plan view drawing of a standard wafer.

A series of coordinate measurements are made on a standard wafer (as the temperature of the standard wafer changes) to produce data for a calibration table comprising values of standard-wafer temperature versus corresponding values of a temperature-correction factor S for the standard wafer. FIG. 2 is a plan-view drawing of a standard wafer 20. (The standard wafer 20 and the wafer 23 are preferably similar in dimensions and composition.) The standard wafer 20 defines several marks X1, X2, Y1, Y2 on its surface. The marks X1, X2, Y1, Y2 are respectively positioned in opposing pairs so as to define X and Y axes $X_W$, $Y_W$, respectively, on the wafer surface. Calibrations can be performed using at least three of the marks, provided the marks are at an appropriate pitch along the axes $X_W$, $Y_W$.

The following process is used to obtain data for the calibration table for the standard wafer. The standard wafer 20 is placed in the load-lock chamber 32 and the load-lock chamber 32 is rapidly evacuated to a desired vacuum level. The resulting adiabatic expansion in the load-lock chamber 32 cools the standard wafer 20 and causes the wafer 20 to contract. The cooled standard wafer 20 is then transported through the gate valve 33 into the vacuum chamber 22 and placed on the wafer stage 24. The host computer 27 commands the stage controller 30 to move the wafer stage 24 so that each of the various marks X1, X2, Y1, Y2 on the standard wafer 20 is sequentially brought into axial alignment with the electron beam EB. At each such axial alignment, stage-position data in the X and Y directions are obtained by the position-measuring sensor 25 for the respective mark. The corresponding stage-position coordinates of each of the marks X1, X2, Y1, Y2 are calculated by the coordinate counter 29 from the stage-position data obtained by the position-measurement sensor 25. Meanwhile, the temperature of the standard wafer 20 is continuously measured by the temperature sensor 26. The resulting temperature data are routed to the host computer 27. The host computer 27 records the stage-position coordinates of each of the marks X1, X2, Y1, Y2 and the respective substrate temperature measured when the various marks were detected (e.g., the average substrate temperature prevailing while detecting each of the marks X1, X2, Y1, Y2).

The cycle of measurement operations described above (i.e., measurement of the coordinates of each of the marks X1, X2, Y1, Y2 on the standard wafer 20) is repeated until the temperature of the standard wafer 20 stabilizes (i.e., equilibrates with the temperature in the vacuum chamber 22) and no further change in the measured stage-position coordinates for each mark are detected from one cycle to the next. After the temperature of the standard wafer 20 stabilizes, the host computer 27 calculates coordinates ($X_{CC}$, $Y_{CC}$) of a "contraction center" of the standard wafer 20. The calculations are made by interpolating changes in the coordinates for each mark X1, X2, Y1, Y2 as a function of substrate temperature. The contraction-center coordinates ($X_{CC}$, $Y_{CC}$) are recorded in a memory in the coordinate-conversion calculator 81. (The contraction center is a point on the wafer 20 that remains stationary during contraction or expansion of the wafer with a change in wafer temperature.) The host computer 27 also calculates temperature-correction factors S of the standard wafer 20 at various temperatures and records the results in the lookup table 82, thereby completing the calibration process.

The temperature-correction factor S is used during exposure to calculate temperature-corrected coordinates. The temperature-correction factor S=α∆T, where ∆ is the coefficient of linear expansion of the standard-wafer material, e.g., silicon (α=∆L/L), and ∆T represents the difference between the standard-wafer temperature and the exposure-environment temperature in the vacuum chamber 22.

Figure 3:
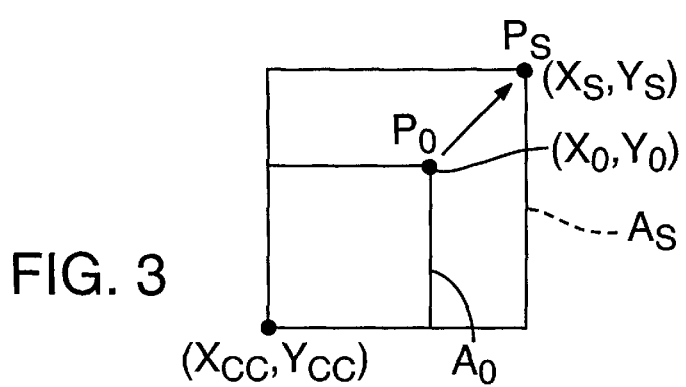
FIG. 3 is a diagram showing the effect of wafer expansion and contraction on positional accuracy.
Figure 4:
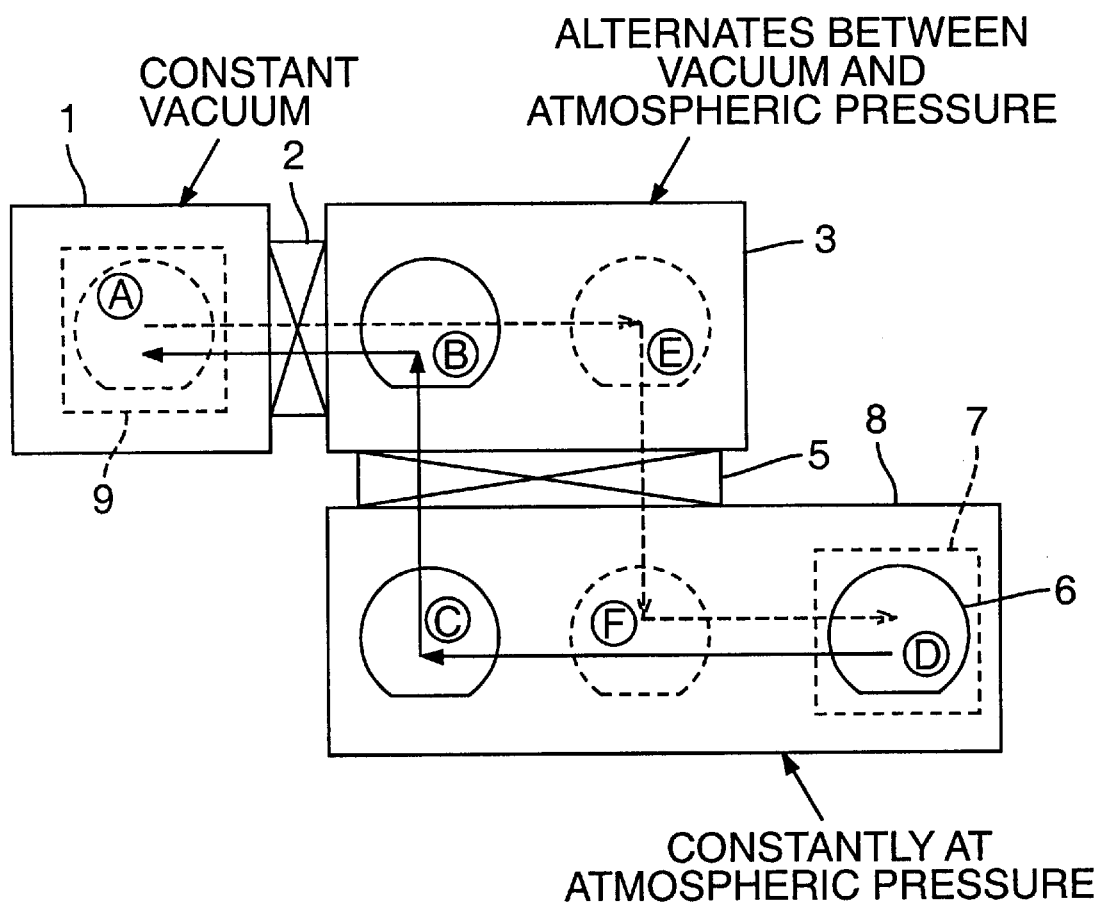
FIG. 4 is a schematic block diagram showing the wafer transport sequence in a conventional CPB exposure apparatus.

The temperature-correction factor S for a given wafer temperature is determined as follows, with reference to FIGS. 2 and 3. The distance between the stabilized coordinate measurements for each mark X1, X2, Y1, Y2 (recorded by the host computer 27) and the contraction-center coordinates $X_{CC}$, $Y_{CC}$ (as determined during calibration) is calculated to establish baseline distances between each mark and the contraction center of the standard wafer corresponding to the exposure-environment temperature of the vacuum chamber 22. For example, let point $P_S$ in FIG. 3 correspond to the coordinate position of the mark X2 in FIG. 2 at a temperature $T_S$, where $T_S$ equals the stabilized temperature. Let the distance between the coordinates of the mark X2 ($P_S$) and the contraction-center coordinates $X_{CC}$, $Y_{CC}$ equal $L_S$. During calibration, several cycles of mark-coordinate measurements are recorded while the standard wafer 20 is in a contracted state. For illustrative purposes let point $P_0$ in FIG. 3 represent the position of the mark X2 at a temperature $T_0$, where the temperature $T_0$ is less than the stabilized temperature $T_S$. Additionally, let the distance between $P_0$ and $X_{CC}$, $Y_{CC}$ equal $L_0$. Since α=∆L/L and S=α∆T, $$S_{T0} = \frac{(L_S - L_0) \cdot (T_S - T_0)}{L_0}. \tag{1}$$

The value of $S_{T0}$ to be stored in the lookup table 82 corresponding to temperature $T_0$ is determined by averaging similar $S_{T0}$ calculations corresponding to the position coordinates of the remaining marks X1, Y1, Y2 obtained during the same measurement cycle, wherein the temperature To is the average temperature measured during the cycle. By repeating the above, multiple values of S, i.e., $S_{T1}$, $S_{T2}$, etc., are determined at various respective temperatures $T_1$, $T_2$, etc., and stored in the lookup table 82.

After calibration is completed using a standard wafer 20, exposure can be performed on multiple respective wafers 23. During exposure of a wafer 23, the host computer 27 sends X–Y position commands to the stage controller 30 to position the wafer stage 24 (and thus the wafer 23) for exposure of a desired location on the wafer. The host computer 27 synchronously provides control signals to the electron-optical column 21 to direct the electron beam EB to the desired location on the wafer 23.

Exposure proceeds as follows. A wafer 23 is transported to the wafer stage 24 of the vacuum chamber 22 from the load-lock chamber 32. The temperature sensor 26 continuously produces data on the actual temperature of the wafer 23 and routes such data to the lookup table 82. The lookup table 82 provides, from the temperature data, corresponding values of the temperature-correction factor S of the wafer 23 (by interpolation if required) and outputs the corresponding coefficient to the coordinate-conversion calculator 81. Meanwhile, the coordinate counter 29 continuously updates the position coordinates of the wafer 23 and sends the updated position coordinates to the coordinate-conversion calculator 81. The coordinate-conversion calculator 81 then performs coordinate conversion of the position coordinates of the wafer 23 using the coefficient of linear expansion S of the wafer and the contraction-center coordinates ($X_{CC}$, $Y_{CC}$).

An example of coordinate conversion is explained below with reference to FIG. 3. In FIG. 3, an area $A_0$ represents a region on a wafer 23 in an initial (e.g., cooled and contracted) state. As the wafer temperature stabilizes to the temperature of its immediate environment (e.g., a warmer exposure-environment temperature), the area $A_0$ changes (e.g., expands) relative to the contraction-center coordinates ($X_{CC}$, $Y_{CC}$), as represented by the dashed-line area $A_S$. During this expansion the point $P_0$ at the upper-right corner of the area $A_0$, moves (relative to the coordinates $X_{CC}$, $Y_{CC}$)) to the upper-right corner of the area $A_S$, as represented by the point $P_S$ The position coordinates of the point $P_0$ are ($X_0$, $Y_0$), and the position coordinates of the point $P_S$ are ($X_S$, $Y_S$). The lower left corner of both areas $A_0$ and $A_S$ is the contraction center having coordinates ($X_{CC}$, $Y_{CC}$). The contraction-center coordinates ($X_{CC}$, $Y_{CC}$) do not change during the contraction or expansion of the wafer 23.

During coordinate conversion the coordinate-conversion calculator 81 performs coordinate-conversion calculations according to the following equations.

$$X_S = X + S \cdot (X - X_{CC}) \quad (2)$$

$$Y_S = Y + S \cdot (Y - Y_{CC}) \quad (3)$$

The coordinate position ($X_S$, $Y_S$) represents a wafer-exposure position when the wafer 23 is at a stabilized temperature. The term S represents the temperaturecorrection factor discussed above. The coordinate position (X, Y) represents the converted coordinate position to which the electron beam EB must be directed to so that the resulting exposure position at the stabilized temperature is at coordinate position ($X_S$, $Y_S$). The desired exposure pattern at the stabilized temperature is stored in either the host computer 27 or in the coordinate-conversion calculator 81.

After the desired exposure location ($X_S$, $Y_S$) and the contraction center ($X_{CC}$, $Y_{CC}$) are known, the converted coordinate location (X, Y) can be calculated according to equations (2) and (3) using the corresponding temperature-correction factor S input to the coordinate-conversion calculator 81. Similar coordinate conversions are made throughout exposure of the wafer 23 by the electron beam as required as the temperature of the wafer 23 stabilizes at the exposure-environment temperature. After the temperature of the wafer 23 has stabilized, exposure of the wafer can be performed without further coordinate corrections.

In the calibration method described above, the temperature-correction factor S of the standard wafer 20 is measured over a relatively narrow temperature range. The temperature range typically extends from the temperature of the wafer 20 (in its contracted state) when the wafer enters the vacuum chamber 22 to the actual exposure-environment temperature inside the vacuum chamber 22. The calibration temperature range can be increased by, e.g., preheating or cooling the standard wafer 20 before the standard wafer 20 is transported to the wafer stage 24. In addition, since the temperature measurements made during each cycle of coordinate measurements (i.e., one temperature measurement is obtained for each mark X1, X2, Y1, Y2 per cycle, thus four temperature measurements for each cycle) are averaged, there are only a limited number of values of the temperature-correction factor S stored in the lookup table 82. In instances in which the wafer temperature measured during an actual exposure does not have a corresponding value of the temperature-correction factor S stored in the lookup table 82, the actual temperature-correction factor at the actual exposure temperature of the wafer can be determined by interpolation. This calculation is performed by the host computer 27 based on a polynomial interpolation of data concerning temperature-correction factors versus wafer temperature stored in the lookup table 82. The results of the calculations can then be routed to the coordinate-conversion calculator 81.

In the process described above, coordinate-position corrections of the electron beam EB were made for a wafer allowed to warm from a cooled, contracted state. This is not meant to be limiting. Dimensional changes of a wafer induced by either an increase or a decrease in wafer temperature can be accounted for according to the invention. Also, in the embodiment described above, the electron-beam exposure position was corrected by deflecting the electron beam relative to the wafer to account for positional errors caused by wafer-temperature changes. Alternatively, correction of the electron-beam exposure position can be accomplished by adjusting the position of the wafer stage relative to the electron beam.

This invention can be applied not only to CPB exposure apparatus, as described above, but also to variable-profile electron-beam etching apparatus and electron-beam projection-exposure apparatus. In projection-exposure apparatus, a large area on a mask can be projected and exposed onto the wafer at a given moment, and magnification errors can occur in single subfields of a segmented mask. To better explain the effect of the magnification errors, reference is again made to FIG. 3. In FIG. 3, the area $A_S$ can represent a single projected subfield when the wafer is at a stable temperature. In contrast, the area $A_0$ can represent a single subfield that should be projected when the wafer is in a cooled, contracted state to produce a subfield of the desired size after the wafer reaches the stable temperature. In this instance, correction can be performed by a variable-magnification correction lens, wherein the magnification can be varied based on the temperature-correction factor S.

This apparatus improves upon conventional apparatus. Since apparatus according to the invention can continually correct the exposure position of the electron beam to compensate for positional errors caused by expansion and contraction of the wafer, it is possible to perform accurate pattern exposure of the wafer even in environments in which the temperature of the wafer is changing. In addition, there is no need to wait until the temperature of the wafer stabilizes to commence exposure, resulting in increased throughput.

Whereas the present invention has been described in connection with a preferred embodiment, it will be understood that the invention is not limited to this embodiment. On the contrary, the invention is intended to cover all alternatives, modifications, and equivalents as may be included within the spirit and scope of the invention as defined in the appended claims.

What is claimed is:

1. A method for exposing a sensitive substrate with a charged-particle beam, comprising the steps:

(a) determining a contraction center of the sensitive substrate;

(b) determining the XY coordinates of a desired exposure location on the substrate at an exposure-environment temperature;

(c) determining the XY displacement of the desired exposure location from the contraction center;

(d) measuring the actual temperature of the substrate at time of exposure;

(e) determining a temperature-correction factor of the substrate based on the measured actual substrate temperature;

(f) based on the results obtained in steps (a), (b), (c), and (e), converting the XY coordinates of the desired exposure location into temperature-corrected exposure coordinates; and (g) exposing the substrate with the charged-particle beam at the temperature-corrected exposure coordinates.

2. The method of claim 1, wherein step (f) is performed according to the expressions: $X_S = X + S \cdot (X - X_{CC})$ and $Y_S = S \cdot (Y - Y_{CC})$ wherein $X_S$ and $Y_S$ are the X and Y coordinates obtained in step (b), $X_{CC}$ and $Y_{CC}$ are X and Y coordinates, respectively, of the contraction center obtained in step (a), S is the temperature-correction factor obtained in step (e) at the temperature of the substrate obtained in step (d), and X and Y are the temperature-corrected coordinates.

3. The method of claim 1, wherein step (a) is performed by a sequence comprising the steps:

providing at least three marks on a standard substrate that are separated from one another;

altering the temperature of the standard substrate from the exposure-environment temperature;

individually aligning each of the marks on the standard substrate with an exposure axis, and at each alignment, measuring XY positional coordinates of the standard substrate;

while allowing the standard substrate to return to the exposure-environment temperature, performing multiple measurements of the XY positional coordinates of each mark as a function of temperature of the standard substrate; and determining the contraction center of the standard substrate as an XY coordinate that undergoes no change with a change in the temperature of the standard substrate.

4. The method of claim 3, wherein step (e) is performed using data from the multiple measurements of the XY positional coordinates of each mark as a function of temperature.

* * * * *

UNITED STATES PATENT AND TRADEMARK OFFICE
CERTIFICATE OF CORRECTION

PATENT NO. : 5,912,096

DATED : June 15, 1999

INVENTOR(S) : Kazunari Hada

It is certified that error appears in the above-identified patent and that said Letters Patent is hereby corrected as shown below:

Column 1, lines 15 and 16, "BACKGROUND OF THE INVENTION OF THE INVENTION" should be --BACKGROUND OF THE INVENTION--.

Column 1, line 37, "10 Torr" should be --$10^{-6}$ Torr--.

Column 2, line 34, "on e" should be --one--.

Column 7, line 6, "area As" should be --area $A_s$--.

Column 7, line 10, insert a period --.-- after "$P_s$".

In the Claims:

Column 9, line 6, claim 2, "$Y_s = S \cdot (Y-Y_{cc})$" should be --$Y_s = Y + S \cdot (Y - Y_{cc})$,--.

Signed and Sealed this

Twenty-ninth Day of February, 2000

*Attest:*

Q. TODD DICKINSON

*Attesting Officer*   *Commissioner of Patents and Trademarks*